United States Patent
Herner (10) Patent No.: US 6,956,278 B2
(45) Date of Patent: Oct. 18, 2005

(54) LOW-DENSITY, HIGH-RESISTIVITY TITANIUM NITRIDE LAYER FOR USE AS A CONTACT FOR LOW-LEAKAGE DIELECTRIC LAYERS

(75) Inventor: S. Brad Herner, San Jose, CA (US)

(73) Assignee: Matrix Semiconductor, Inc., Santa Clara, CA (US)

(*) Notice: Subject to any disclaimer, the term of this patent is extended or adjusted under 35 U.S.C. 154(b) by 35 days.

(21) Appl. No.: 10/611,245

(22) Filed: Jun. 30, 2003

(65) Prior Publication Data

US 2004/0262702 A1 Dec. 30, 2004

(51) Int. Cl.[7] .......................... H01L 29/00; H01L 29/04
(52) U.S. Cl. .......................... 257/530; 257/50; 257/529
(58) Field of Search ................................. 257/530, 529, 257/50; 438/131, 467, 600, 957

(56) References Cited

U.S. PATENT DOCUMENTS

| | | | | | |
|---|---|---|---|---|---|
| 4,823,181 | A | * | 4/1989 | Mohsen et al. ............. | 257/530 |
| 5,329,153 | A | * | 7/1994 | Dixit .......................... | 257/530 |
| 5,341,043 | A | * | 8/1994 | McCollum ................... | 326/38 |
| 5,464,790 | A | * | 11/1995 | Hawley ....................... | 438/600 |
| 5,510,646 | A | * | 4/1996 | Forouhi et al. ............. | 257/530 |
| 5,550,400 | A | * | 8/1996 | Takagi et al. ............... | 257/530 |
| 6,034,882 | A | * | 3/2000 | Johnson et al. ............. | 365/103 |

OTHER PUBLICATIONS

Dimitriadis, C.A,et al. ,"Characteristics of TiNx/n–Si Schottky diodes deposited by reactive magnetron sputtering", *Journal of applied Physics*, vol. 85, No. 8, (Apr. 15, 1999), 4238–4242.

Evangelou, E.K , et al. ,"Characterization of magnetron sputtering deposited thin films of TiN for Use as a metal electrode on TiN/SiO2/Si metal–oxide–semiconductor devices", *Journal of Applied Physics*, vol. 88, No. 12, (Dec. 15, 2000),7192–7196.

Logothetidis, S ,et al. ,"In situ spectroscopic ellipsometry to monitor the process of TiNx thin films deposited by reactive sputtering", *J. Appl. Phys.* 77 (*3*), (Feb. 1, 1995), 1043–1047.

Mao, D,et al. ,"Ionized physical vapor deposition of titanium nitride: Plasma and film characterization", *J. Vac. Sci. Technol. A 20* (2), (Mar./Apr. 2002),379–387.

Patsalas, P ,et al. ,"Combined electrical and mechanical properties of titanium nitride thin films as metallization materials", *Journal of Applied Physics* vol. 86, No. 9, (Nov. 1, 1999),5296–5298.

Tanaka, Yoichiro ,et al. ,"Properties of titanium nitride film deposited by ionized metal plasma source", *J. Vac. Sci. Technol. B 17* (2), (Mar./Apr. 1999),416–422.

* cited by examiner

*Primary Examiner*—Shouxiang Hu
(74) *Attorney, Agent, or Firm*—Pamela J. Squyres (57) ABSTRACT

A low-density, high-resistivity layer of a PVD sputter-deposited material, preferably titanium nitride, when coupled with a dielectric, makes a superior low-leakage insulating barrier for use in semiconductor devices. The material is created by sputtering methods that cause the ions to strike the deposition surface with reduced energy, for example in an ion metal plasma chamber with no self-bias accelerating ions normal to the deposition surface, or in a standard PVD chamber with pressure increased.

30 Claims, 6 Drawing Sheets

LOW-DENSITY, HIGH-RESISTIVITY TITANIUM NITRIDE LAYER FOR USE AS A CONTACT FOR LOW-LEAKAGE DIELECTRIC LAYERS

BACKGROUND OF THE INVENTION

Many semiconductor devices include a dielectric layer between two conductors. If this dielectric is imperfect, leakage current across the dielectric may adversely affect device performance.

The invention relates to the use in semiconductor devices of a low-density, high-resistivity metal layer, preferably titanium nitride. Paired with a dielectric, the layer reduces leakage current across the dielectric.

It is known in the art that ionized metal plasma deposition of titanium nitride with no applied self-bias creates a low-density, high-resistivity titanium nitride (see Tanaka et al., "Properties of titanium nitride film deposited by ionized metal plasma source," Journal of Vacuum Science Technology, March/April 1999), but the usefulness of this material in semiconductor devices according to the present invention has not been previously recognized.

SUMMARY OF THE INVENTION

The present invention is defined by the following claims, and nothing in this section should be taken as a limitation on those claims. In general, the invention is directed to a low-density, high-resistivity material which can be paired with a dielectric to form a low-leakage contact, and its use in semiconductor devices.

A first aspect of the invention provides for a method for forming titanium nitride in a semiconductor device comprising providing a surface for a semiconductor device; and depositing a film of titanium nitride on the surface by physical vapor deposition wherein, for any portion of the film more than about 20 angstroms thick, the density of the titanium nitride is less than about 4.0 grams per cubic cm.

Another aspect of the invention provides for a semiconductor device comprising a first conductive or semiconductive material; a layer of titanium nitride, wherein, for any portion of the titanium nitride layer more than about 20 angstroms thick, the resistivity of the titanium nitride is greater than about 300 microOhm-cms and the density is less than about 4.25 grams per cubic cm; and a dielectric layer interposed between the first conductive or semiconductive material and the titanium nitride layer.

Yet another aspect of the invention calls for a semiconductor device comprising silicon; in contact with the silicon, a layer of silicon dioxide or silicon nitride; and in contact with the silicon dioxide or silicon nitride layer, a layer of nitrogen-rich titanium nitride, wherein, for any portion of the titanium nitride layer more than about 20 angstroms thick, the ratio of titanium to nitrogen is greater than about 1.2:1 and the density is less than about 4.0 grams per cubic cm.

A preferred embodiment provides for a method for making a thin film transistor comprising forming a polysilicon layer; forming a silicon dioxide layer in contact with the polysilicon layer; forming a titanium nitride layer in contact with the silicon dioxide layer wherein, for any portion of the titanium nitride layer more than about 20 angstroms thick, the resistivity of the titanium nitride is greater than about 300 microOhm-cms and the density of the titanium nitride is less than about 4.25 grams per cubic cm; and patterning and etching the titanium nitride.

Another embodiment provides for a monolithic three dimensional memory array comprising polysilicon; in contact with the polysilicon, a layer of silicon dioxide or silicon nitride; and in contact with the silicon dioxide or silicon nitride layer, a layer of titanium nitride, wherein, for any portion of the titanium nitride layer more than about 20 angstroms thick, the resistivity of the titanium nitride is greater than about 300 microOhm-cms and the density of the titanium nitride is less than about 4.25 grams per cubic cm.

An aspect of the invention provides for a method for forming titanium nitride in a semiconductor device comprising providing a surface for a semiconductor device; and depositing on the surface a film of titanium nitride by physical vapor deposition wherein, for any portion of the film more than about 20 angstroms thick, the deposition is performed with substantially no self-bias and with pressure greater than about 15 mTorr.

Another aspect of the invention provides for a method for forming titanium nitride for use in a semiconductor device comprising providing a surface for a semiconductor device; on the surface, depositing titanium nitride wherein, for any portion of the titanium nitride layer more than about 20 angstroms thick, the resistivity of the titanium nitride is greater than about 300 microOhm-cms and the ratio of nitrogen to titanium is greater than about 1.2:1.

A preferred embodiment provides for a semiconductor device comprising a dielectric-rupture antifuse; and a layer of low-density, high-resistivity material in contact with the antifuse wherein the low-density, high-resistivity material is titanium nitride, tungsten nitride, tantalum nitride, titanium tungsten, tungsten, or aluminum, and wherein a portion of the low-density, high-resistivity material having a thickness greater than about 20 angstroms was deposited by physical vapor deposition in a chamber with substantially no self-bias.

Another aspect of the invention provides for a semiconductor device comprising a dielectric layer; a titanium nitride layer in contact with the dielectric layer wherein, for any portion of the titanium nitride layer thicker than about 20 angstroms, the ratio of nitrogen to titanium is greater than about 1.2:1, and wherein, for any portion of the titanium nitride layer thicker than about 20 angstroms, the resistivity of the titanium nitride layer is greater than about 300 microOhm-cms.

A preferred embodiment provides for a method for forming titanium nitride in a semiconductor device comprising providing a surface for a semiconductor device; and depositing a film of titanium nitride on the surface by physical vapor deposition wherein the density of the titanium nitride is less than about 4.0 grams per cubic cm.

Another preferred embodiment provides for a semiconductor device comprising a first conductive or semiconductive material; a layer of titanium nitride the resistivity of the titanium nitride is greater than about 300 microOhm-cms and the density is less than about 4.25 grams per cubic cm; and a dielectric layer interposed between the first conductive or semiconductive material and the titanium nitride layer.

Yet another preferred embodiment provides for a semiconductor device comprising silicon; in contact with the silicon, a layer of silicon dioxide or silicon nitride; and in contact with the silicon dioxide or silicon nitride layer, a layer of nitrogen-rich titanium nitride, wherein the ratio of titanium to nitrogen is greater than about 1.2:1 and the density is less than about 4.0 grams per cubic cm.

Another preferred embodiment provides for a method for making a thin film transistor comprising forming a polysilicon layer; forming a silicon dioxide layer in contact with the polysilicon layer; forming a titanium nitride layer in contact with the silicon dioxide layer wherein the resistivity of the titanium nitride is greater than about 300 microOhm-cms and the density of the titanium nitride is less than about 4.25 grams per cubic cm; and patterning and etching the titanium nitride.

Still another preferred embodiment provides for a monolithic three dimensional memory array comprising polysilicon; in contact with the polysilicon, a layer of silicon dioxide or silicon nitride; and in contact with the silicon dioxide or silicon nitride layer, a layer of titanium nitride, wherein the resistivity of the titanium nitride is greater than about 300 microOhm-cms and the density of the titanium nitride is less than about 4.25 grams per cubic cm.

An aspect of the invention provides for a memory array comprising memory cells on a die, wherein the memory cells comprise diode portions and an antifuse, wherein the diode portions comprise doped polysilicon, and wherein median leakage current across the antifuse for the memory cells on the die is less than about $1.77 \times 10^{-13}$ amps/$\mu$m$^2$.

Another aspect of the invention provides for a semiconductor device comprising an antifuse; and a layer of low-density, high-resistivity material in contact with the antifuse, such that the leakage current across the antifuse in contact with the low-density, high-resistivity material is less than one-tenth the leakage current across an identical antifuse in contact with an analogous material when the analogous material is formed in the presence of self-bias or decreased pressure.

Still another aspect of the invention provides for a semiconductor device comprising an antifuse; and a layer of low-density, high-resistivity material in contact with the antifuse, wherein the density of the low-density, high-resistivity material is less than about 75 percent of the material's theoretical density, such that the leakage current across the antifuse in contact with the low-density, high-resistivity material is less than one-tenth the leakage current across an identical antifuse in contact with an analogous material when the density of the analogous material is substantially equivalent to its theoretical density.

Each of the aspects of the invention and embodiments can be used alone or in combination with one another.

The preferred embodiments will now be described with reference to the attached drawings.

DETAILED DESCRIPTION OF THE INVENTION

Many semiconductor devices require a conductor or semiconductor to be separated from another conductor or semiconductor by a dielectric (an electrical insulator.) All dielectrics will allow some current to flow under an applied biasing voltage. This current is called leakage current, and adversely affects device performance. Some such devices include permanent dielectrics, as in capacitors and field effect transistors. Others include dielectric rupture antifuses, which provide an insulator until the antifuse is ruptured.

The present invention calls for use of a low-density high-resistivity conductor, preferably produced by sputtering. The conductor is titanium nitride, tungsten nitride, tantalum nitride, titanium tungsten, tungsten, or aluminum, preferably titanium nitride. In some embodiments, the conductor is not stoichiometric (a compound is stoichiometric when its ratio of cations to anions is exactly that specified by its chemical formula.) The ratio of nitrogen to titanium, rather than 1:1, may be more than about 1.2:1, preferably between about 1.3:1 and 1:4:1.

Figure 1:
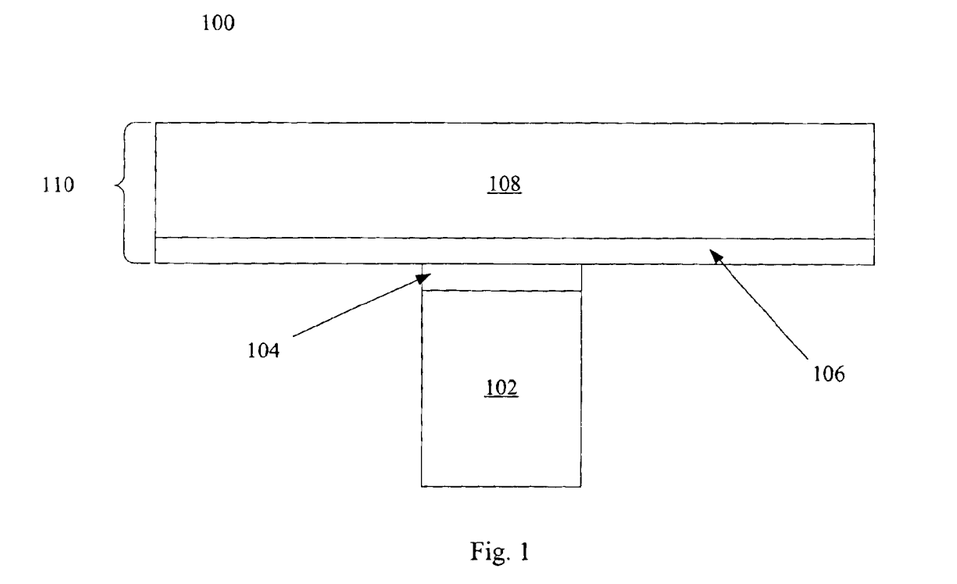
FIG. 1 is a cross-sectional view of a memory cell according to the present invention.

Herner et al., U.S. patent application Ser. No. 10/326,470, "An Improved Method for Making High Density Nonvolatile Memory," filed Dec. 19, 2003 and hereby incorporated by reference, (henceforth the '470 application) uses this low-density, high-resistivity titanium nitride in a monolithic three dimensional memory array. In embodiments of this memory array, as shown in FIG. 1, each memory cell 100 comprises a vertically-oriented post-shaped PN diode 102 with an antifuse 104 formed on top of the diode. The antifuse 104 separates and electrically isolates the diode 102 from an overlying conductor 110. The bottom layer 106 of conductor 110 is preferably low-density, high-resistivity titanium nitride as described herein. Use of this low-density, high-resistivity titanium nitride in the '470 application is the work of the present inventor. Layer 108 is a conductor, preferably tungsten. The memory cell 100 is programmed by applying a high voltage across antifuse 104. When such a voltage is applied, the antifuse is ruptured, and current can flow between diode 102 and conductor 110. Ideal device performance calls for minimal leakage current before antifuse rupture, and good contact after.

When made according to the instructions provided in the '470 application, leakage current between diode 102 and the overlying conductor 110 is unexpectedly low before the antifuse 104 is ruptured. The nature of the titanium nitride forming the bottom layer 106 of the conductor proves to be the reason for this low leakage. An analogous low-leakage barrier could also be formed using tungsten nitride, tantalum nitride, titanium tungsten, tungsten, or aluminum. (If antifuse 104 is silicon dioxide, however, tungsten and aluminum are less advantageous choices, as tungsten does not adhere well to silicon dioxide and aluminum reduces silicon dioxide.)

Figure 2A:
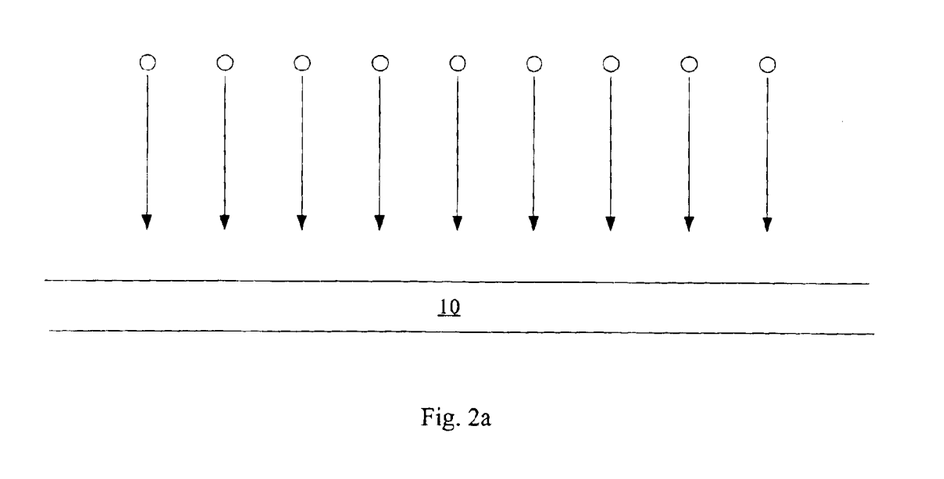
FIGS. 2a and 2b are cross-sectional views showing physical vapor deposition with and without self-bias.

This titanium nitride layer is deposited by sputtering or physical vapor deposition (PVD.) Sputtering or PVD is performed either with or without applied self-bias voltage, which accelerates metal ions in the direction normal to the substrate. Titanium nitride may be deposited by an ionized metal plasma (IMP) method, a PVD method normally applying self-bias. This acceleration toward the substrate, shown in FIG. 2a, helps assure good bottom coverage in trenches. In this method, a titanium target is sputtered with a mixture of Ar and $N_2$ gas. A plasma is generated by applying RF power to an inductive coil located inside the chamber.

Figure 2B:
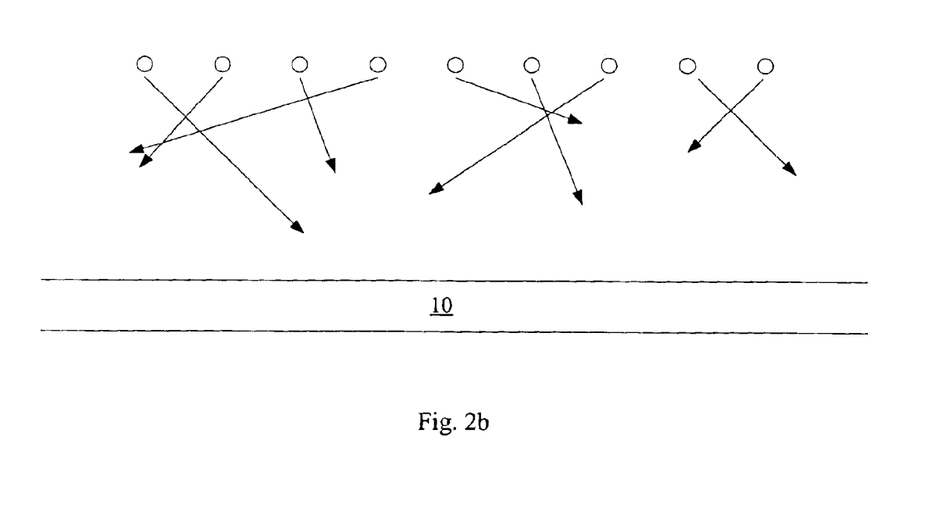

Normally IMP PVD films are deposited at higher pressures (about 20 mTorr) than PVD processes without self-bias (these are normally deposited at about 0.5 to about 5 mTorr.) Both processes produce dense, low-resistivity films. However, when a film is sputtered at higher pressure without self-bias (as in FIG. 2b), the film is low density with increased resistivity. The films can also have a higher ratio of nitrogen to titanium than films deposited at lower pressure. This low-density, high-resistivity titanium nitride, when paired with a dielectric, provides a very low-leakage barrier and can be usefully employed in many devices.

Figure 3:
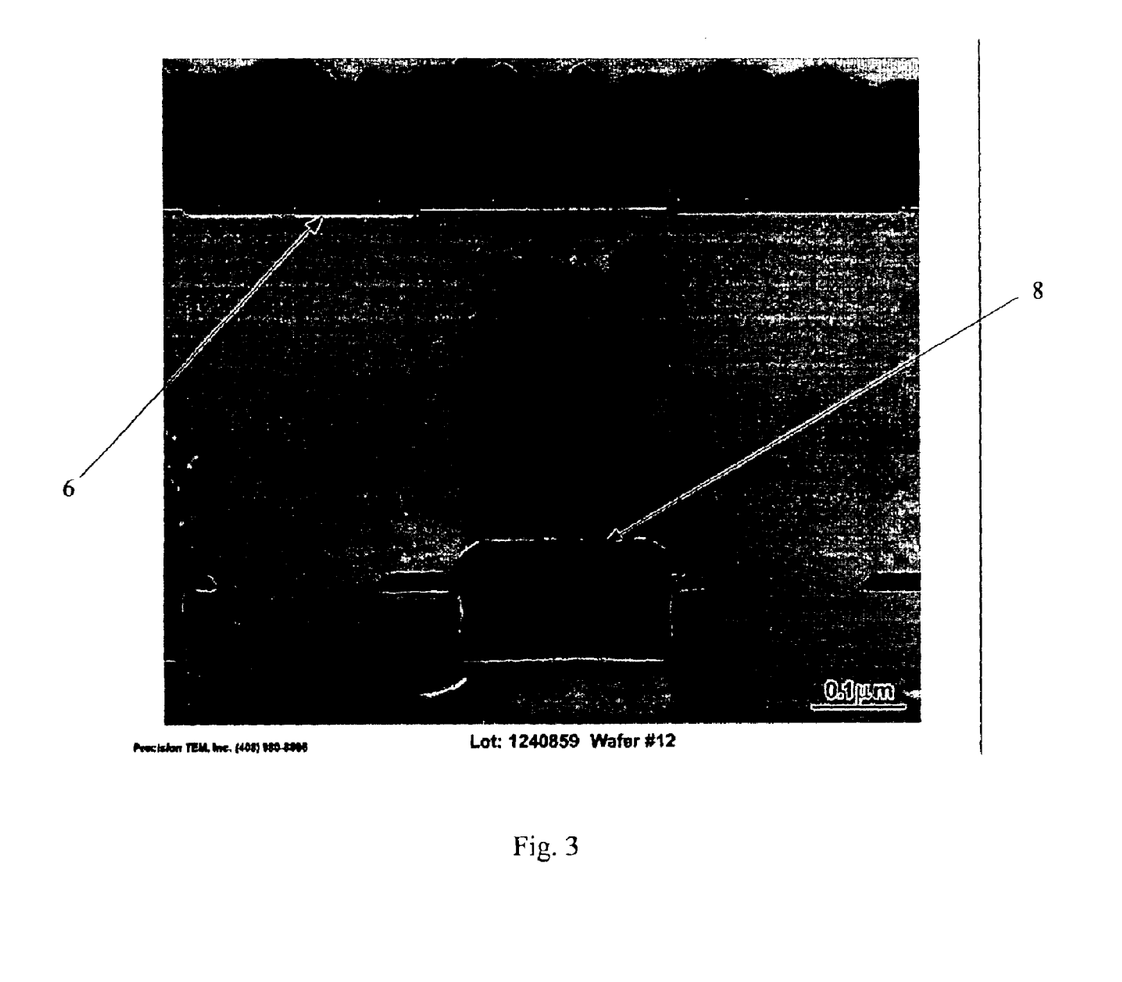
FIG. 3 is a TEM image showing both low-density and higher-density titanium nitride.

The resulting titanium nitride is spongy, with a rough surface, and has a lower density and a higher resistivity than conventionally formed titanium nitride. FIG. 3 shows a TEM cross-section including a layer 6 of low-density, high-resistivity titanium nitride, as well as a layer 8 of conventional, denser titanium nitride; the difference in texture is evident. Denser, lower-resistivity titanium nitride formed by PVD at lower pressure has a density greater than about 4.33 grams per cubic centimeter, while low-density, high-resistivity titanium nitride used in the present invention has a density less than about 4.25 grams per cubic centimeter, preferably less than about 4.0 grams per cubic centimeter, preferably about 3.98 grams per cubic centimeter. Resistivity for conventionally formed titanium nitride varies between about 70 and about 130 microOhm-cms, while resistivity of the low-density, high-resistivity titanium nitride used in the present invention is greater than about 300 microOhm-cms, preferably greater than 500 microOhm-cms, more preferably greater than 1000 microOhm-cms.

A layer or film of titanium nitride having the lower density and higher resistivity noted for any portion of the layer or film with a thickness greater than about 20 angstroms will have the advantageous properties described herein.

Figure 4:
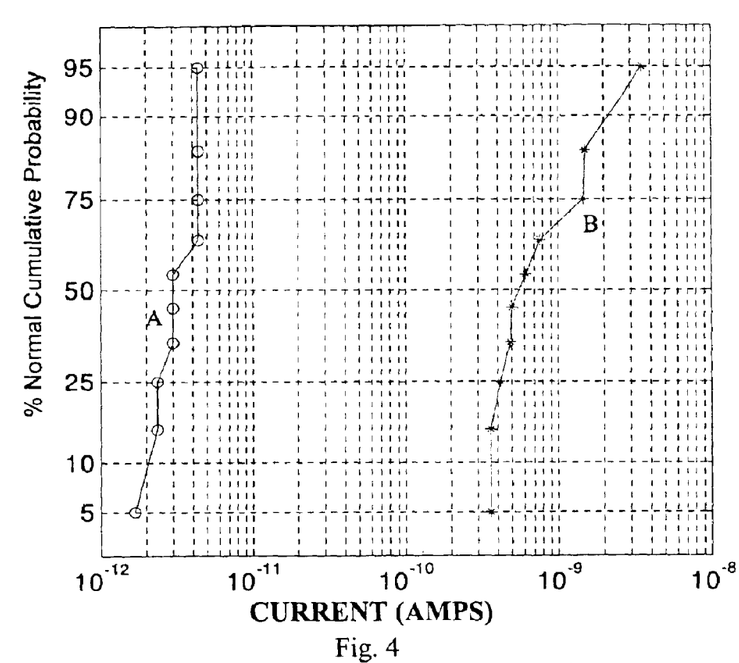
FIG. 4 is a chart comparing leakage current across antifuses of devices formed with and without the low-density, high-resistivity titanium nitride used in the present invention.

When low-density, high-resistivity titanium nitride is used adjacent to the antifuse, the pre-rupture leakage current across the antifuse is very much less than when conventionally-formed titanium nitride is used, as shown in FIG. 4. The plot of FIG. 4 is probability plot, in which each data point is the measurement of one device on a wafer. The probability plot allows the distribution for many devices to be shown, giving statistical significance to the data.

The layer of low-density, high-resistivity titanium nitride in this example is adjacent to an antifuse, which is intended, before rupture, to allow minimal leakage current. The antifuse has a roughly circular shape with a diameter of about 0.15 $\mu$m. The cross-sectional area for which the leakage is measured, then, is:

$$\pi \times ((0.15 \mu m)/2)^2 = 0.0177 \mu m^2$$

In this case the median leakage current, with 2 volts applied across the antifuse, was reduced from $5.5 \times 10^{-10}$ amps for conventional dense titanium nitride, shown on curve B, to a median of close to $3 \times 10^{-12}$ amps for low-density, high-resistivity titanium nitride, shown on curve A; an improvement of greater than three orders of magnitude. Actual values for leakage current will vary with the thickness and material of the dielectric used, the dimensions of the device, etc., but it can be assumed that use of the low-density, high-resistivity titanium nitride (or one of the other materials named) used in the present invention will decrease leakage current to less than one-tenth the leakage current in the same device when conventionally formed titanium nitride (or its counterpart) is used. A material of the same chemical composition but a different density, resistivity, and/or stoichiometry is referred to as "an analogous material"; for example, stoichiometric, high-density titanium nitride is an analogous material to low-density, high-resistivity titanium nitride.

It has been shown that leakage current of less than $10^{-11}$ amps can be achieved across a pre-ruptured antifuse with an area of about 0.0177 $\mu m^2$. Thus, normalizing for the area of the antifuse, a memory array comprising memory cells on a die, wherein the memory cells comprise diode portions and an antifuse, and wherein the median leakage current across the antifuse for the memory cells on the die is less than about $1.77 \times 10^{-13}$ amps/$\mu m^2$, can be formed. The advantages of the low-density, high-resistivity titanium nitride and analogous materials would benefit memory arrays including diode portions formed of monocrystalline silicon as well as polysilicon.

Figure 5:
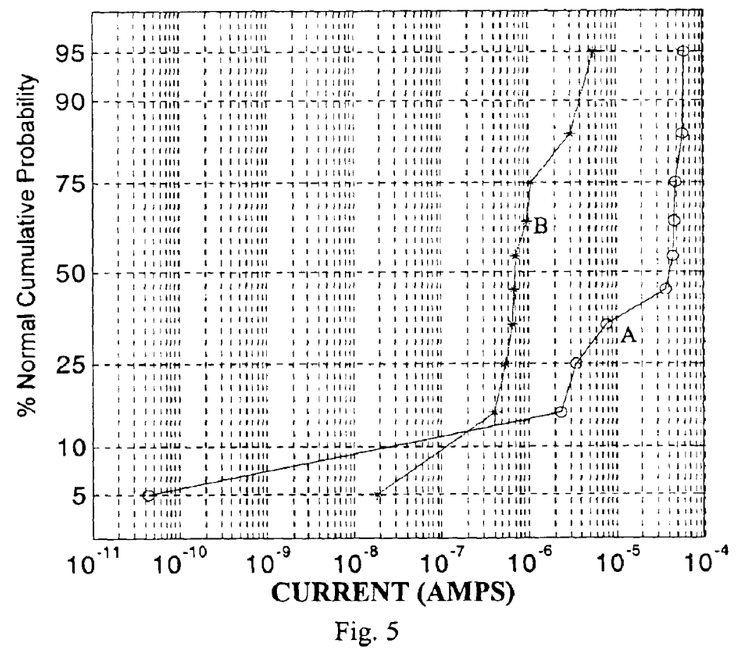
FIG. 5 is a chart comparing current after rupture of the antifuse in devices formed with and without the low-density, high-resistivity titanium nitride used in the present invention.

The forward current after rupture is also significantly better than when standard titanium nitride is used, as shown in FIG. 5. Low-density, high-resistivity titanium nitride is used on curve A, and conventional, denser titanium nitride on curve B.

Method of Making

A detailed description of a method for making the low-density, high-resistivity titanium nitride used in the present invention is provided for illustration. It will be understood, however, that some of these detailed steps can be altered, supplemented, or omitted while still falling within the scope of the invention.

In embodiments of the monolithic three dimensional memory array described in the '470 application, semiconductor elements comprising diodes are formed by depositing doped polycrystalline silicon, herein called polysilicon, which is then patterned and etched into posts. The gaps between the semiconductor elements are filled with dielectric, then the dielectric planarized, for example by chemical mechanical polishing (CMP) or etchback, to expose the tops of the semiconductor elements. In preferred embodiments, a silicon dioxide antifuse is then thermally grown on the polysilicon semiconductor elements.

The next layer to be deposited is the low-density, high-resistivity titanium nitride. The wafer is placed in an Applied Materials Endura IMP chamber. After an initial flow of 25 standard cubic centimeters per minute (sccm) of Ar and 45 sccm of $N_2$, a plasma is generated by applying RF power inside the chamber, and DC power of 4000 watts is applied. During deposition $N_2$ flow is reduced to 28 sccm. No self-bias is applied to accelerate metal ions toward the wafer surface. Deposition continues for 41 seconds, yielding about 200 angstroms of titanium nitride. During deposition, pressure in the chamber should be measured at between about 15 and about 40 mTorr, preferably between about 20 mTorr and about 40 mTorr, preferably about 20 mTorr. After deposition is complete, the wafer is moved to another chamber for deposition of the next layer, preferably tungsten deposited by chemical vapor deposition (CVD.)

Low-density, high-resistivity titanium nitride can also be produced in a standard PVD chamber, one designed with no capacity for self-bias directing ions normal to the deposition substrate. For example, the Applied Materials Endura PVD chamber can be used. During standard operation, titanium nitride is deposited in this and similar chambers at 0.5–5 mTorr. To deposit low-density, high-resistivity titanium nitride, the pressure in the PVD chamber during sputter must be increased to about 20 mTorr. It is believed the higher pressure decreases the energy of the sputtered atoms before they reach the surface of the wafer.

Pressure in a PVD chamber can be controlled by (among other things) the gate valve. Typically the gate valve has three settings: full (fully open), mid (partially open), and closed. Nearly all PVD recipes use the gate valve in the full position. To reach 20 mTorr, the chamber must run with the valve in the mid position, which slows escape of gases in the chamber, increasing the pressure. The mid position is adjusted during tool startup to achieve this pressure, and is typically not adjusted again for the life of the chamber.

The mid position of the valve should be adjusted to select the desired pressure. This can be done according to manufacturers' instructions.

Alternatively, the antifuse layer 104 (of FIG. 1) can be formed of silicon nitride instead of silicon dioxide. This is preferably done by forming the PN diode 102 according to the teachings of the '470 application, and filling and planarizing to expose the top of PN diode 102. Next, silicon nitride is thermally grown, for example in a rapid thermal annealing tool at 750 to 800 degrees Celsius, flowing 4 liters/minute of $NH_3$ for 60 seconds at atmospheric pressure, with a temperature ramp rate of 50 degrees C. per second, forming a layer of silicon nitride preferably about 23 angstroms thick. The silicon nitride antifuse could be deposited instead. This layer of silicon nitride serves as antifuse 104. The low-density, high-resistivity titanium nitride layer is formed next, as before.

The leakage current associated with a silicon nitride antifuse is generally higher than, for example, a silicon dioxide antifuse. Pairing a silicon nitride with a higher-resistivity conductor reduces leakage current across the silicon nitride antifuse significantly. Silicon nitride antifuses have the advantage of a faster time to rupture than silicon dioxide antifuses, allowing memory cells to be programmed faster.

Antifuses formed of silicon nitride can also be ruptured at a lower breakdown field, thus requiring less power. In the device described in the '470 application, for example, in top antifuse embodiments when the diameter of the diode is about 0.15 $\mu$m, a voltage of about 10 volts is required to reliably rupture antifuses formed of silicon dioxide. When silicon nitride antifuses are used in the same device at the same diode diameter, the antifuse can be ruptured at lower voltages, for example 6–8 volts. This allows memory cells to be scaled to smaller devices, as lower voltages allow smaller programming transistors to be used.

To form analogous low-leakage barriers using tungsten nitride, tantalum nitride, titanium tungsten, tungsten, or aluminum, similar fabrication methods can be used. A tungsten or tantalum target can be sputtered with $N_2$ in an IMP chamber with no self-bias, or in a PVD chamber with increased pressure to make tungsten nitride or tantalum nitride; or a titanium tungsten target can be sputtered under the conditions described to make titanium tungsten. A tungsten or aluminum target can be sputtered with a neutral gas, like Ar. PVD sputtering in high-pressure conditions should create the low-density, high-resistivity compounds used in the present invention.

The resulting low-density, high-resistivity counterpart of each of these sputtered metals or compounds will have a density at most 75 percent of the metal or compound's theoretical density. For example, the theoretical density of aluminum is 2.7 grams/cm$^3$; thus its low-density, high-resistivity counterpart has a density of 2.03 grams/cm$^3$ or less. Similarly, the theoretical density of tungsten is 19.3 grams/cm$^3$; thus its low-density, high-resistivity counterpart has a density of about 14.48 grams/cm$^3$ or less. Tantalum nitride has a theoretical density of about 16.3 grams/cm$^3$; thus its low-density, high-resistivity counterpart has a density of about 12.23 grams/cm$^3$ or less.

The methods used to form the low-density, high-resistivity titanium nitride layer used adjacent to the antifuse in the monolithic three-dimensional memory array of the '470 application, or the other metals named, can, of course, be used to create a similar layer in other devices that require a low-leakage barrier.

Methods to deposit the low-density, high-resistivity titanium nitride (and the other named metals) used in the present invention in an IMP chamber and a standard PVD chamber have been disclosed, but clearly other methods could be envisioned. Any method which produces low-density, high-resistivity titanium nitride, or the other named metals, as described herein will fall within the scope of the invention.

Use in Devices

The following section will describe the use of low-density high-resistivity titanium nitride, tungsten nitride, tantalum nitride, titanium tungsten, tungsten, or aluminum in devices using a low-leakage barrier. For simplicity, the examples given herein will name titanium nitride as the metal used, but it will be apparent to one skilled in the art that the other named metals, tungsten nitride, tantalum nitride, titanium tungsten, tungsten or aluminum could be used instead in any of these devices or in other devices. Clearly tungsten is a less advantageous choice if the layer is directly on and in contact with an underlying oxide, since, as noted earlier, tungsten doesn't adhere to silicon dioxide; and aluminum is less advantageous when formed adjacent to an oxide, as it tends to reduce oxides. It is routine for the skilled practitioner to choose compatible materials.

Many devices which require low leakage current across a dielectric can benefit from use of this low-density, high resistivity titanium nitride. Several non-limiting examples are provided. In each device, suggested steps and materials are provided for making the device. It will be understood that these steps and materials are provided for clarity, but that steps could be changed, added, or omitted while the device and/or methods to produce it still fall within the scope of the invention.

Schottky Diode with Junction Antifuse

A Schottky diode is a rectifying contact between a semiconductor and a metal. An incipient Schottky diode can be formed in many configurations. This example will describe a Schottky diode formed at the intersection of two rails, the semiconductor in one rail, the metal in the other, the two separated by an antifuse, as taught in Vyvoda, U.S. patent application Ser. No. 10/440,882, "Rail Schottky Device and Method of Making," filed May 19, 2003, assigned to the assignee of the present invention and hereby incorporated by reference. This device is an incipient Schottky diode, which becomes a Schottky diode when the antifuse is ruptured. Some of the methods and details described here by way of illustration are described more fully in Vyvoda. For simplicity, not all of the details of Vyvoda are reproduced in this description, but none of the teaching of Vyvoda is intended to be excluded.

Figure 6:
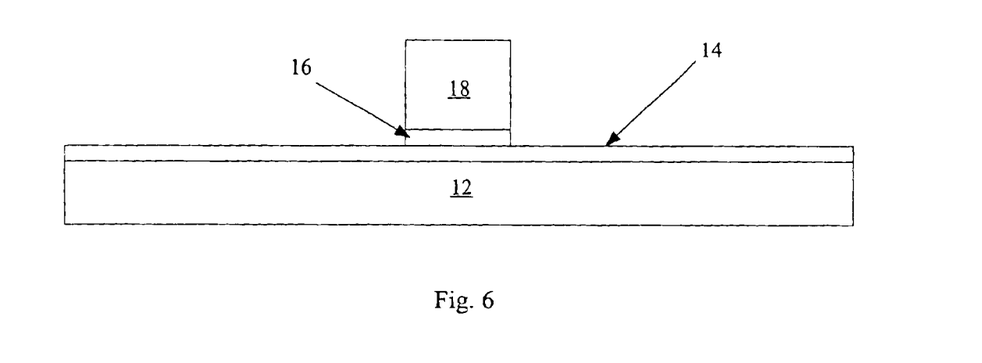
FIG. 6 is a cross-sectional view of a Schottky diode according to the present invention.

Turning to FIG. 6, a plurality of incipient Schottky diodes using the low-density, high-resistivity titanium nitride used in the present invention can be formed by depositing a doped semiconductor layer 12, for example doped polysilicon, preferably by in situ doping, then patterning and etching semiconductor layer 12 into substantially parallel rails. A rail can include other layers below semiconductor rail 12, and can be formed over a semiconductor substrate (not shown.) Next a dielectric (not shown) is deposited over and between semiconductor rails 12, then planarized, for example by CMP or etchback, to expose the tops of the rails. An antifuse layer 14 is formed on top of layer 12. Antifuse layer 12 is a dielectric antifuse capable of being ruptured. Antifuse layer 14 can also be deposited. If semiconductor layer 12 is formed of doped polysilicon, antifuse layer 14 can be thermally grown silicon dioxide. In this case it will exist only over semiconductor rails 12 but not between them, as it derives its silicon from the polysilicon of semiconductor layer 12; if it is deposited it will exist between the rails as well.

Next a low-density, high-resistivity titanium nitride layer 16 is preferably formed according to the methods disclosed herein, for example by deposition in an IMP chamber with no self-bias, or by deposition in a standard PVD chamber with no self-bias and with pressure increased to, for example, 20 mTorr. A thickness of, for example, about 200 angstroms of titanium nitride can be formed. The titanium nitride of Vyvoda is created by PVD without self-bias, with no teaching to increase the pressure in the chamber, and thus is normal high-density titanium nitride, not the low-density, high-resistivity titanium nitride described herein.

In preferred embodiments disclosed in Vyvoda, the next layer 18 is doped polysilicon. Layer 18 could also be a metal, for example tungsten. Tungsten can be deposited, for example by CVD. Next tungsten or polysilicon layer 18 and titanium nitride layer 16 are patterned and etched to form rails substantially perpendicular to underlying semiconductor rails 12. Semiconductor layer 12, antifuse layer 14, and titanium nitride layer 16 form an incipient Schottky diode. After antifuse 14 is ruptured by applying high current, semiconductor layer 12 and titanium nitride layer 16 form a Schottky diode.

As in the PN diode example of the '470 application, it would be expected that the forward current after rupture of the antifuse would be improved by use of the low-density high-resistivity titanium nitride described.

Also as in the PN diode described above, antifuse 14 can advantageously be formed of silicon nitride for a memory cell with faster programming time.

Field Effect Transistor

Figure 7:
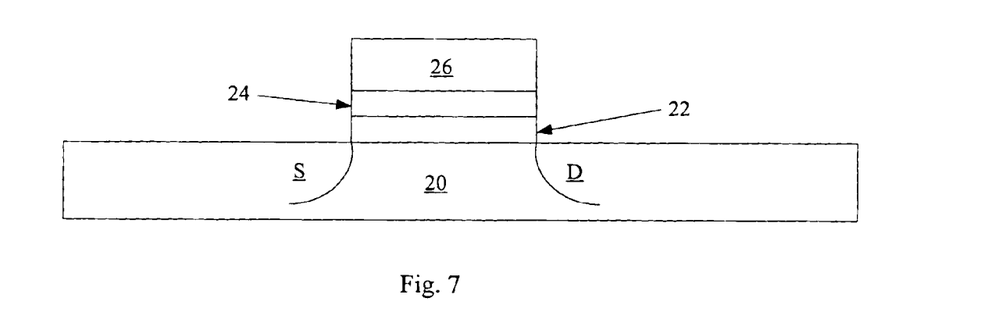
FIG. 7 is a cross-sectional view of a field effect transistor according to the present invention.

A field effect transistor can make use of the low-leakage layer used in the present invention. Turning to FIG. 7, such a field effect transistor is formed on channel region 20, which may be polysilicon, monocrystalline silicon, silicon on insulator, or some other semiconductor material. A dielectric layer 22 is grown or deposited on channel region 20, then layer 24 of low-density, high-resistivity titanium nitride is formed on dielectric layer 22. The entire gate can be of titanium nitride, or a layer 26 of some other conductive material, for example tungsten, can be formed on top. Alternately, layer 24 can be low-density, high-resistivity titanium nitride, while layer 26 is more standard higher-density, lower-resistivity titanium nitride formed conventionally. Gate layers 26 and 24 and dielectric layer 22 are then patterned and etched to form a gate and gate dielectric. Source S and drain D are formed, for example, by ion implantation.

SONOS-type memory Cell

Figure 8:
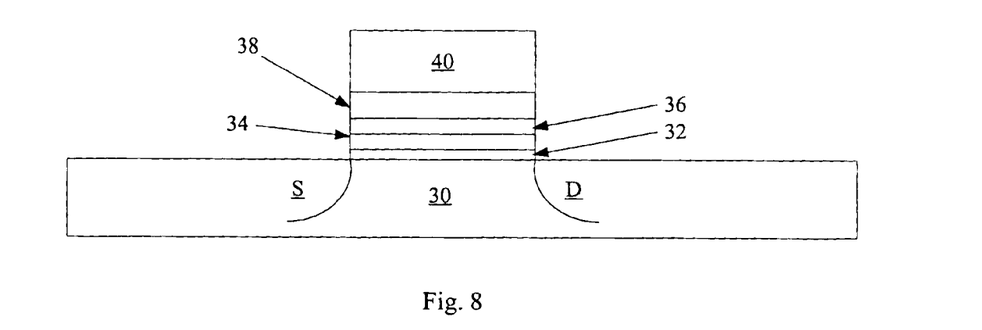
FIG. 8 is a cross-sectional view of a SONOS-type device according to the present invention.

A SONOS-type memory cell, shown in FIG. 8, comprises a channel 30 (with adjacent source S and drain D), a tunnel dielectric 32, a charge trapping layer 34, a blocking dielectric 36, and a gate electrode, here comprising conductive layers 38 and 40. Typically in a SONOS device, the channel is formed of silicon, the tunnel dielectric of oxide, the charge trapping layer of nitride, the blocking dielectric of oxide, and the gate electrode of silicon; the silicon-oxide-nitride-oxide-silicon stack gives the SONOS device its name, though alternate materials may be used for each layer named. The term "SONOS-type" device or memory cell means a charge trapping device with a tunnel dielectric, a dielectric charge trapping layer and a blocking dielectric, all between a channel and a gate electrode, irrespective of materials.

When a voltage is applied to the gate electrode 38/40, charge carriers tunnel through the tunnel dielectric 32 and are trapped in the charge trapping layer 34. The presence or absence of stored charge in charge trapping layer 34 can be sensed, and distinguishes a programmed cell from an unprogrammed cell.

A method is provided to form a SONOS-type memory cell using the low-density, high-resistivity titanium nitride used in the present invention, though many other methods to form a SONOS device are known and can be used with the titanium nitride used in the present invention.

The SONOS-type memory cell will be formed on channel region 30, which may be polysilicon, monocrystalline silicon, silicon on insulator, or some other semiconductor material. A dielectric layer 32 is grown or deposited on channel region 30; for example a thin layer of silicon dioxide can be thermally grown on a silicon or polysilicon substrate. A charge trapping layer 34, for example silicon nitride, is formed on tunneling dielectric 32. A blocking dielectric 36, for example deposited silicon dioxide, is formed on charge trapping layer 34.

On and in contact with blocking dielectric 36, low-density high-resistivity titanium nitride layer 38 is formed, preferably by the unbiased high-pressure PVD methods mentioned earlier. The gate electrode layer stack optionally also includes layer 40, preferably of tungsten, though standard titanium nitride or other conductors or semiconductors can be used instead. Layers 40, 38, 36, 34, and 32 are patterned and etched to form the SONOS-type memory cell. Source S and drain D regions are formed by ion implantation.

Floating Gate Memory Cell

Figure 9:
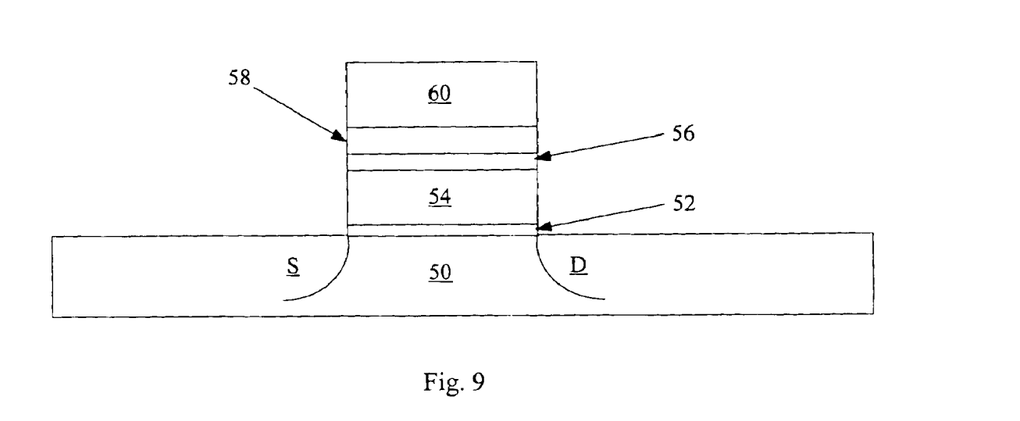
FIG. 9 is a cross-sectional view of a floating gate memory cell according to the present invention.

A floating gate memory cell, shown in FIG. 9, comprises a channel 50 (with adjacent source S and drain D), a tunnel dielectric 52, a floating gate 54, a blocking dielectric 56, and a control gate, here comprising conductive layers 58 and 60.

When a voltage is applied to the control gate 58/60, charge carriers are injected and trapped in floating gate 54, which is typically formed of a semiconductor. The presence or absence of stored charge in floating gate 54 can be sensed, and distinguishes a programmed cell from an unprogrammed cell.

A method is provided to form a floating gate memory cell using the low-density, high-resistivity titanium nitride used in the present invention, though many other methods to form a floating gate memory cell are known and can be used with the low-density high-resistivity titanium nitride used in the present invention.

The floating gate memory cell will be formed on channel region 50, which may be polysilicon, monocrystalline silicon, silicon on insulator, or some other semiconductor material. A dielectric layer 52 is grown or deposited on channel region 50; for example a thin layer of silicon dioxide can be thermally grown on a silicon or polysilicon substrate. A floating gate layer 54, for example of doped polysilicon, is formed on tunneling dielectric 52. A blocking dielectric 56, for example deposited silicon dioxide, is deposited on floating gate layer 54.

On and in contact with blocking dielectric 56, low-density high-resistivity titanium nitride layer 58 is formed, preferably by the unbiased, high-pressure PVD methods mentioned earlier. The control gate layer stack optionally also includes layer 60, preferably of tungsten, though standard titanium nitride or other conductors or semiconductors can be used instead. Layers 60, 58, 56, 54, and 52 are patterned and etched to form the floating gate memory cell. Source S and drain D regions are formed by ion implantation.

Capacitor

Figure 10:
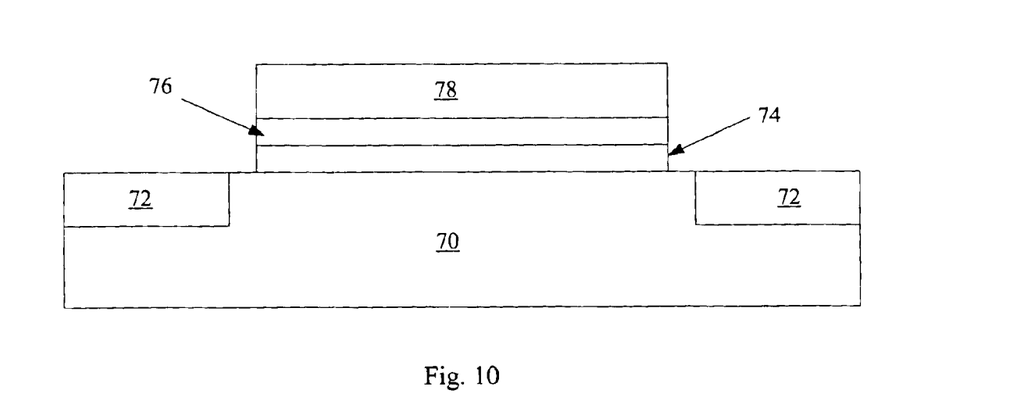
FIG. 10 is a cross-sectional view of a capacitor according to the present invention.

A capacitor stores charge by using a dielectric to separate charge-bearing layers of conductor or semiconductor material. FIG. 10 shows a very simple capacitor.

Substrate 70 is a conductor or a semiconductor, preferably doped monocrystalline or polycrystalline silicon between field oxide regions 72. A layer of low-density, high-resistivity titanium nitride 74 is formed on substrate 70. A dielectric 76 is formed next, then a second layer 78 of low-density, high-resistivity titanium nitride is formed atop the dielectric 76. Titanium nitride layer 78, dielectric layer 76, and titanium nitride layer 74 are patterned and etched to form a capacitor.

In this example, low-density, high-resistivity titanium nitride was formed below and in contact with dielectric 76, as well as above and in contact with dielectric 76. Clearly either one or the other of low-density, high resistivity titanium nitride layers 74 or 78 could be omitted and replaced with some other conductor or semiconductor.

Monolithic three dimensional memories are described in Johnson et al., U.S. Pat. No. 6,034,882, "Vertically Stacked Field Programmable Nonvolatile Memory and Method of Fabrication"; in Johnson, U.S. Pat. No. 6,525,953, "Vertically Stacked Field Programmable Nonvolatile Memory and Method of Fabrication"; Knall et al., U.S. Pat. No. 6,420,215, "Three Dimensional Memory Array and Method of Fabrication"; Lee et al., U.S. patent application Ser. No. 09/927,648, "Dense Arrays and Charge Storage Devices, and Methods for Making Same," filed Aug. 13, 2001; Walker et al., U.S. application Ser. No. 10/335,089, "Method for Fabricating Programmable Memory Array Structures Incorporating Series-Connected Transistor Strings," filed Dec. 31, 2002; Scheuerlein et al., U.S. application Ser. No. 10/335,078, "Programmable Memory array Structure Incorporating Series-Connected Transistor Strings and Methods for Fabrication and Operation of Same," filed Dec. 31, 2002; and Vyvoda et al., all assigned to the assignee of the present invention and herein incorporated by reference. The memory cells in these memory arrays are diodes, incipient diodes, or charge-storage cells such as SONOS-type or floating gate cells. Low-density, high-resistivity titanium nitride, tungsten nitride, tantalum nitride, titanium tungsten, tungsten, or aluminum according to the present invention can be used in any of these memory arrays when a low-leakage dielectric separating conductors or semiconductors is described. The low-density, high-resistivity material used in the present invention can be formed adjacent the dielectric to make a very low-leakage layer. The low-density, high-resistivity material can be used on any level of memory.

In some monolithic three-dimensional memory arrays taught in these incorporated patents and applications, the memory cells comprise diode portions and antifuses. The diode portions may be found in either rails or pillars. A silicon nitride antifuse can be advantageously paired with the low-density high-resistivity material (titanium nitride, tungsten nitride, tantalum nitride, titanium tungsten, tungsten, or aluminum) described herein.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A semiconductor device comprising:
   a first conductive or semiconductive layer;
   a layer of titanium nitride, wherein at least a portion of the titanium nitride layer is more than about 20 angstroms thick, has resistivity greater than about 300 microOhm-cms and density less than 4.25 grams per cubic cm; and
   a dielectric layer interposed between and in direct contact with the first conductive or semiconductive layer and the titanium nitride layer,
   wherein the dielectric layer forms a dielectric rupture antifuse.

2. The semiconductor device of claim 1 wherein the titanium nitride layer is over the dielectric layer.

3. The semiconductor device of claim 2 wherein the first conductive or semiconductive layer comprises silicon.

4. The semiconductor device of claim 3 wherein the first conductive or semiconductive layer is silicon.

5. The semiconductor device of claim 4 wherein the first conductive or semiconductive layer is polysilicon.

6. The semiconductor device of claim 4 wherein the dielectric layer comprises silicon dioxide.

7. The semiconductor device of claim 6 wherein the silicon layer is a portion of a diode.

8. The semiconductor device of claim 1 wherein the dielectric layer is silicon nitride.

9. The semiconductor device of claim 8 wherein the device is a portion of a memory cell in a monolithic three dimensional memory.

10. The semiconductor device of claim 9 wherein the memory cells comprise pillars.

11. The semiconductor device of claim 9 wherein the memory cells are formed at the intersections of rails.

12. The semiconductor device of claim 1 wherein, for the portion of the titanium nitride layer more than about 20 angstroms thick, the density is less than about 4.0 grams per cubic cm.

13. A semiconductor device comprising:
    a silicon layer;
    in contact with the silicon layer, a layer of silicon dioxide or silicon nitride; and
    in contact with the silicon dioxide or silicon nitride layer, a layer of nitrogen-rich titanium nitride, wherein at least a portion of the titanium nitride layer is more than about 20 angstroms thick, in that portion the ratio of titanium to nitrogen is greater than about 1.2:1, the density is less than 4.25 grams per cubic cm and resistivity is greater than about 300 microOhms-cms.
    wherein the silicon dioxide or silicon nitride layer is interposed between the silicon layer and the titanium nitride layer,
    wherein the layer of silicon dioxide or silicon nitride forms a dielectric rupture antifuse.

14. The device of claim 13 wherein the silicon dioxide or silicon nitride layer is over the silicon layer, and the titanium nitride is over the silicon dioxide or silicon nitride layer.

15. The device of claim 14 wherein the silicon layer comprises polysilicon.

16. The device of claim 15 wherein the device comprises a diode portion.

17. The device of claim 14 wherein the silicon dioxide or silicon nitride layer is thermally grown.

18. The device of claim 13 wherein at least a portion of the titanium nitride layer is more than about 20 angstroms thick, the portion is formed by physical vapor deposition with substantially no self-bias.

19. A monolithic three dimensional memory array comprising:
a polysilicon layer;
in contact with the polysilicon layer, a layer of silicon dioxide or
silicon nitride; and
in contact with the silicon dioxide or silicon nitride layer, a layer of titanium nitride, wherein at least a portion of the titanium nitride layer is more than about 20 angstroms thick, has resistivity greater than about 300 microOhm-cms and density less than 4.25 grams per cubic cm,
wherein the silicon dioxide or silicon nitride layer is interposed between the polysilicon layer and the titanium nitride layer, and
the layer of silicon dioxide or silicon nitride forms a dielectric rupture antifuse.

20. The monolithic three dimensional memory array of claim 19, wherein the array comprises diode portions.

21. The monolithic three dimensional memory array of claim 20, wherein the silicon dioxide or silicon nitride layer is silicon dioxide.

22. The monolithic three dimensional memory array of claim 20, wherein the silicon dioxide or silicon nitride layer is silicon nitride.

23. A semiconductor device comprising:
a dielectric-rupture antifuse; and
a layer of low-density, high-resistivity titanium nitride in contact with the antifuse, and wherein at least a portion of the low-density, high-resistivity titanium nitride has a thickness greater than about 20 angstroms, and it is deposited by physical vapor deposition in a chamber with substantially no self-bias,
wherein the portion of the layer of low-density, high-resistivity titanium nitride has a resistivity greater than about 300 microOhm-cms and a density less than 4.25 grams per cubic cm.

24. The semiconductor device of claim 23 wherein the antifuse comprises silicon dioxide.

25. The semiconductor device of claim 23 wherein the antifuse comprises silicon nitride.

26. The semiconductor device of claim 23 wherein the titanium nitride is formed with a pressure in the chamber greater than about 15 mTorr.

27. The semiconductor device of claim 23 wherein the antifuse and the titanium nitride are portions of a monolithic three dimensional memory.

28. A semiconductor device comprising:
a first conductive or semiconductive layer;
a layer of titanium nitride wherein the resistivity of the titanium nitride is greater than about 300 microOhm-cms and the density is less than 4.25 grams per cubic cm; and
a dielectric layer interposed between and in direct contact with the first conductive or semiconductive layer and the titanium nitride layer,
wherein the the dielectric layer forms a dielectric rupture antifuse.

29. A semiconductor device comprising:
a silicon layer;
in contact with the silicon layer, a layer of silicon dioxide or silicon nitride; and
in contact with the silicon dioxide or silicon nitride layer, a layer of nitrogen-rich titanium nitride, wherein the ratio of titanium to nitrogen is greater than about 1.2:1 and the density is less 4.25 grams per cubic cm and resistivity is greater than about 300 microOhms-cms,
wherein the silicon dioxide or silicon nitride layer is interposed between the silicon layer and the titanium nitride layer,
wherein the layer of titanium nitride is deposited by physical vapor deposition in a chamber with substantially no self-bias; and the layer of silicon dioxide or silicon nitride forms a rupture antifuse.

30. A monolithic three dimensional memory array comprising:
a polysilicon layer;
in contact with the polysilicon layer, a layer of silicon dioxide or silicon nitride; and
in contact with the silicon dioxide or silicon nitride layer, a layer of titanium nitride, wherein the resistivity of the titanium nitride is greater than about 300 microQhm-cms and the density of the titanium nitride is less than 4.25 grams per cubic cm,
wherein the silicon dioxide or silicon nitride layer is interposed between the polysilicon layer and the titanium nitride layer, and
wherein the layer of silicon dioxide or silicon nitride forms a dielectric rupture antifuse.

* * * * *